United States Patent
Singh et al.

(10) Patent No.: US 10,403,810 B2
(45) Date of Patent: Sep. 3, 2019

(54) MAGNETIC DIODE IN ARTIFICIAL MAGNETIC HONEYCOMB LATTICE

(71) Applicant: The Curators of the University of Missouri, Columbia, MO (US)

(72) Inventors: Deepak Kumar Singh, Columbia, MO (US); Brock Summers, Columbia, MO (US); Ashutosh Dahal, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 15/978,042

(22) Filed: May 11, 2018

(65) Prior Publication Data
US 2019/0058110 A1 Feb. 21, 2019

Related U.S. Application Data

(60) Provisional application No. 62/504,856, filed on May 11, 2017.

(51) Int. Cl.
| | | |
|---|---|---|
| G11C 11/16 | (2006.01) | |
| G11C 11/56 | (2006.01) | |
| (Continued) | | |

(52) U.S. Cl.
CPC ........... *H01L 43/02* (2013.01); *G11C 11/16* (2013.01); *G11C 11/161* (2013.01);
(Continued)

(58) Field of Classification Search
CPC ....... H01L 43/02; H01L 43/10; G11C 11/161; G11C 11/5607; G11C 11/16; G11C 19/02
See application file for complete search history.

(56) References Cited

U.S. PATENT DOCUMENTS

| | | | | |
|---|---|---|---|---|
| 6,730,421 B1 * | 5/2004 | Kirino | ...................... | G11B 5/72 428/336 |
| 2005/0164035 A1 * | 7/2005 | Lee | ........................ | G11B 5/855 428/823 |

(Continued)

OTHER PUBLICATIONS

Summers et al., "Magnetic Diode at T=300 K", Advanced Electronic Materials 2018, 4 pages.
(Continued)

*Primary Examiner* — Ngan V Ngo
(74) *Attorney, Agent, or Firm* — Thompson Coburn LLP; Steven M. Ritchey

(57) ABSTRACT

A magnetic artificial honeycomb lattice comprising a multiplicity of connecting elements separated by hexagonal cylindrical pores, wherein:
(a) the hexagonal cylindrical pores:
  (i) have widths that are substantially uniform and an average width that is in a range of about 15 nm to about 20 nm; and
  (ii) are substantially equispaced and have an average center-to-center distance that is in a range of about 25 nm to about 35 nm; and
(b) the connecting elements comprise a magnetic material layer, and the connecting elements have:
  (i) lengths that are substantially uniform and an average length that is in a range of about 10 nm to about 15 nm;
  (ii) widths that are substantially uniform and an average width that is in a range of about 4 nm to about 8 nm; and
  (iii) a thickness of the magnetic material layer that is substantially uniform and an average thickness that is in a range of about 2 nm to about 8 nm; and
(Continued)

(c) the magnetic artificial honeycomb lattice has a surface area, disregarding the presence of the hexagonal cylindrical pores, that is in a range in a range of about 100 $mm^2$ to about 900 $mm^2$.

20 Claims, 13 Drawing Sheets

(51) Int. Cl.

| | |
|---|---|
| G11C 19/02 | (2006.01) |
| H01F 10/14 | (2006.01) |
| H01F 10/26 | (2006.01) |
| H01F 41/20 | (2006.01) |
| H01F 41/34 | (2006.01) |
| H01L 27/22 | (2006.01) |
| H01L 43/02 | (2006.01) |
| H01L 43/10 | (2006.01) |
| H01L 43/12 | (2006.01) |

(52) U.S. Cl.
CPC .......... *G11C 11/5607* (2013.01); *G11C 19/02* (2013.01); *H01F 10/142* (2013.01); *H01F 10/26* (2013.01); *H01F 41/20* (2013.01); *H01F 41/34* (2013.01); *H01L 27/224* (2013.01); *H01L 43/10* (2013.01); *H01L 43/12* (2013.01)

(56) References Cited

U.S. PATENT DOCUMENTS

| | | | |
|---|---|---|---|
| 2008/0075978 A1* | 3/2008 | Weller | G11B 5/656 428/826 |
| 2014/0152409 A1* | 6/2014 | Rotem | G01R 33/383 335/306 |
| 2018/0068702 A1* | 3/2018 | Jung | G11C 11/161 |

OTHER PUBLICATIONS

Summers et al., "Supplementary Materials: Magnetic Diode at T=300 K", Advanced Electronic Materials 2018, 1 page.

Summers et al., "Supplementary Materials: Temperature Dependent Magnetism and Asymmetric Current Biasing in Artifical Honeycomb Lattice", APS Mar. Meeting, 2017, 7 pages.

Summers et al., "Temperature Dependent Magnetism and Asymmetric Current Biasing in Artifical Honeycomb Lattice", APS Mar. Meeting, 2017, 8 pages.

* cited by examiner

MAGNETIC DIODE IN ARTIFICIAL MAGNETIC HONEYCOMB LATTICE

CROSS-REFERENCE TO RELATED APPLICATIONS

The present application is a non-provisional application claiming the benefit of U.S. Ser. No. 62/504,856, filed May 11, 2017, which is incorporated herein by reference in its entirety.

STATEMENT REGARDING FEDERALLY SPONSORED RESEARCH OR DEVELOPMENT

This invention was made with government support under DE-SC0014461 awarded by the U.S. Department of Energy, Office of Basic Energy Sciences. The government has certain rights in the invention.

FIELD OF THE INVENTION

The invention is generally directed to macroscopic-size magnetic artificial honeycomb lattices, their manufacture, and use.

BACKGROUND OF INVENTION

An artificial magnetic honeycomb lattice that manifests a two-dimensional prototype of three-dimensional geometrically frustrated magnets yields a magnetism that has been intensively explored in recent times. The ice analogue of magnetism, spin ice, spin liquid, and exotic quantum mechanical properties of the resonant valence bond state have been of particular interest. The concept of an artificial honeycomb lattice or a two dimensional artificial structure was originally conceived to study the physics of spin ice state. From there, the exploration expanded to include a spectrum of the novel magnetism in geometrically frustrated magnets and a broad and tunable range of magnetic phenomena that would be difficult or impossible to achieve in natural materials. All of which became possible due to a recent proposal that suggests a magnetic moment or spin can be considered as a pair of magnetic charges of opposite polarities, as if it is a "dumbbell," that interact via the Coulomb interaction. The direction of magnetic moment or spin points from the negative to the positive charge.

Extending the concept of magnetic charges to the artificial honeycomb lattice results in each vertex of the honeycomb possessing a net magnetic charge of ±3 or ±1 unit (see FIGS. 1 (a)-(c)). The charges ±3 and ±1 are associated to the peculiar spin configurations where the magnetic moment, aligned along the bond length due to the magnetostatic interaction, either points to or away from the vertex at the same time or, two of them point to (or away) from the vertex and one points away (or to) the vertex, respectively. These moment arrangements are also called "all-in" or "all-out" and "two-in & one-out" or vice-versa spin configurations. At sufficiently a high temperature, the lattice can be described as a paramagnetic gas consisting a random distribution of ±3 and ±1 magnetic charges. Recent theoretical calculations have shown that an artificial magnetic honeycomb lattice can undergo a variety of novel ordered regimes of correlated spins and magnetic charges of both fundamental and practical importance as a function of temperature, including long-range spin ice, entropy-driven magnetic charge-ordered state, and spin-order due to the spin chirality as a function of reducing temperature. At a low enough temperature, magnetic correlation is expected to develop into a spin solid state density in which the magnetization profile assumes a chiral vortex configuration involving six vertexes of the honeycomb lattice (see FIG. 1(d)). The spin solid state, manifested by the distribution of the pairs of vortex states of opposite chiralities across the lattice, provides a unique opportunity to realize a magnetic material with net zero entropy and magnetization for an ordered ensemble of magnetic moments.

The experimental efforts to realize the temperature dependent magnetic correlations in an artificial honeycomb lattice is limited due to the constraints of known nanofabrication methods based on electron-beam lithography (EBL). The EBL technique results in a small sample size with large connecting element (or bond of the honeycomb lattice), on the order of 500 nanometers to a few micrometers. Such large element sizes lead to the inter-elemental energy of $10^4$-$10^5$ K. Therefore, thermal fluctuations cannot induce spin flip or induce the development of a new phase. Also, the small sample size rules out the application of macroscopic probes necessary for magnetic and electrical measurements that are key to exploring the magnetic phases in artificial honeycomb lattice.

A need still exists for a magnetic system that exhibits unidirectional current biasing at a modest current (resulting in reasonably small output power) without the application of magnetic field. Additionally, is desirable for any such device to operate at room temperature in order to facilitate its use in practical applications.

SUMMARY OF INVENTION

In one embodiment, the present invention is directed to a method of making a making a magnetic artificial honeycomb lattice, the method comprising depositing a layer of magnetic material on a substrate, wherein:

the substrate comprises an artificial honeycomb lattice topography, wherein the artificial lattice topography is over a surface area of the substrate that is in a range in a range of about 100 mm² to about 900 mm², and wherein the artificial lattice topography comprises a multiplicity of connecting elements separated by hexagonal cylindrical pores, wherein:
  (a) the hexagonal cylindrical pores:
    (i) have widths that are substantially uniform and an average width that is in a range of about 15 nm to about 20 nm;
    (ii) are substantially equispaced and have an average center-to-center distance that is in a range of about 25 nm to about 35 nm; and
    (iii) have depths extending inward from the surface of the substrate that are substantially uniform and an average depth that is in a range of about 5 nm to about 10 nm; and
  (b) the connecting elements have:
    (i) lengths that are substantially uniform and an average length that is in a range of about 10 nm to about 15 nm;
    (ii) widths that are substantially uniform and an average width that is in a range of about 4 nm to about 8 nm; and
    (iii) heights that are substantially uniform corresponding to the depths of the hexagonal cylindrical pores; and wherein the layer of magnetic material is deposited on substantially only the uppermost surfaces of the connecting elements of the artificial honeycomb lattice topography of the substrate, and wherein the magnetic material layer has a thickness that is substantially uniform and an average thickness that is in a range of about 2 nm to about 8 nm.

In another embodiment, the present invention is directed to a magnetic artificial honeycomb lattice comprising a multiplicity of connecting elements separated by hexagonal cylindrical pores, wherein:
(a) the hexagonal cylindrical pores:
  (i) have widths that are substantially uniform and an average width that is in a range of about 15 nm to about 20 nm; and
  (ii) are substantially equispaced and have an average center-to-center distance that is in a range of about 25 nm to about 35 nm; and
(b) the connecting elements comprise a magnetic material layer, and the connecting elements have:
  (i) lengths that are substantially uniform and an average length that is in a range of about 10 nm to about 15 nm;
  (ii) widths that are substantially uniform and an average width that is in a range of about 4 nm to about 8 nm; and
  (iii) a thickness of the magnetic material layer that is substantially uniform and an average thickness that is in a range of about 2 nm to about 8 nm; and
(c) the magnetic artificial honeycomb lattice has a surface area, disregarding the presence of the hexagonal cylindrical pores, that is in a range in a range of about 100 $mm^2$ to about 900 $mm^2$.

In yet another embodiment, the present invention is directed to a method of adjusting the degree of the asymmetric differential electrical conductance (or unidirectional electronic transport) of the above-described magnetic artificial honeycomb lattice without varying the amount of current or the current bias, the method comprising:
(a) varying the temperature of the magnetic artificial honeycomb lattice;
(b) applying a magnetic field to the magnetic artificial honeycomb lattice; or
(c) both (a) and (b).

BRIEF DESCRIPTION OF THE DRAWINGS

FIG. 1A shows a honeycomb lattice vertex with the typical 2-out 1-in depicted in FIG. 1B and the all-out spin arrangement in FIG. 1C, which results in net magnetic charges of ±Q and ±3Q, respectively. FIG. 1D shows magnetic charges at the vertexes of an artificial honeycomb lattice, which theoretical research suggests that at sufficiently low temperature arrange themselves to create a spin solid state manifested by the periodic arrangement of pairs of chiral vortex states. FIG. 1E is a full size atomic force micrograph of an artificial honeycomb lattice derived from diblock porous template combined with reactive ion etching as disclosed in certain embodiments herein. The bond length, width, and lattice separation are approximately 12 nm, 5 nm and 26 nm, respectively. FIG. 1F is an atomic force micrograph of a metallic honeycomb lattice fabricated as described in Example 1 below.

FIG. 4A shows M vs. T data in zero field cool (ZFC) and field cool (FC) measurements at characteristic fields. M vs T measurements in different fields not only exhibit strong temperature dependence but also reveal multiple ordering regimes as functions of field and temperature (also see inset). FIG. 4B shows the spin solid state configuration, used to simulate the off-specular polarized reflectometry profile in FIG. 4D. FIG. 4C shows off-specular neutron reflectometry data recorded with spin-up incident polarization at T=300 K and 5 K, respectively. Here, the x-axis indicates the inplane correlation while the y-axis indicates the out-of-plane correlation. The specular reflection at room temperature, indicating paramagnetic state, is replaced by a broad diffuse scattering extending along the x-axis, primarily due to the development of the spin solid phase. FIG. 4D shows numerically simulated off-specular neutron reflectometry profiles for paramagnetic (weakly FM) honeycomb film (left) and the spin solid state (right) are consistent with the experimental data. Compared to the off-specular data where very weak intensity is observed, specular reflection is strong in the FM case (left). Unlike the FM case, simulated profile using the spin solid state (as shown in FIG. 4B exhibits bands of broad scattering along the horizontal axis (right) with almost negligible specular intensity.

FIG. 5A shows M vs. T for applied fields of 250 G and 500 G. FIG. 5B shows M vs. H at 20 K. Perpendicular data does not show any jumps near zero field, indicating no chiral loop formations.

DETAILED DESCRIPTION OF INVENTION

Figure 1B:
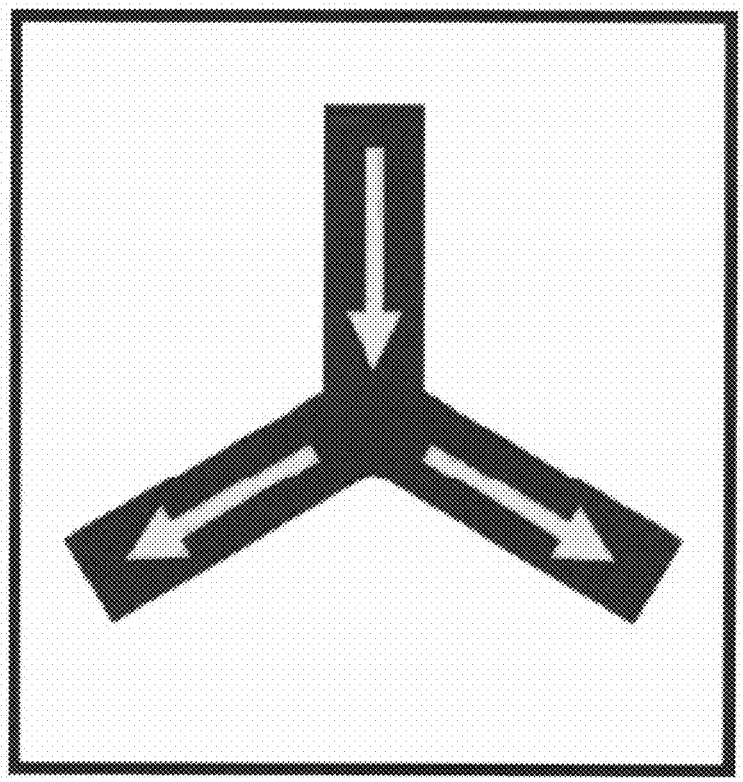
FIGS. 1A, 1B, 1C, and 1D are schematic depictions of spin configurations on a two dimensional honeycomb lattice vertex
Figure 1A:
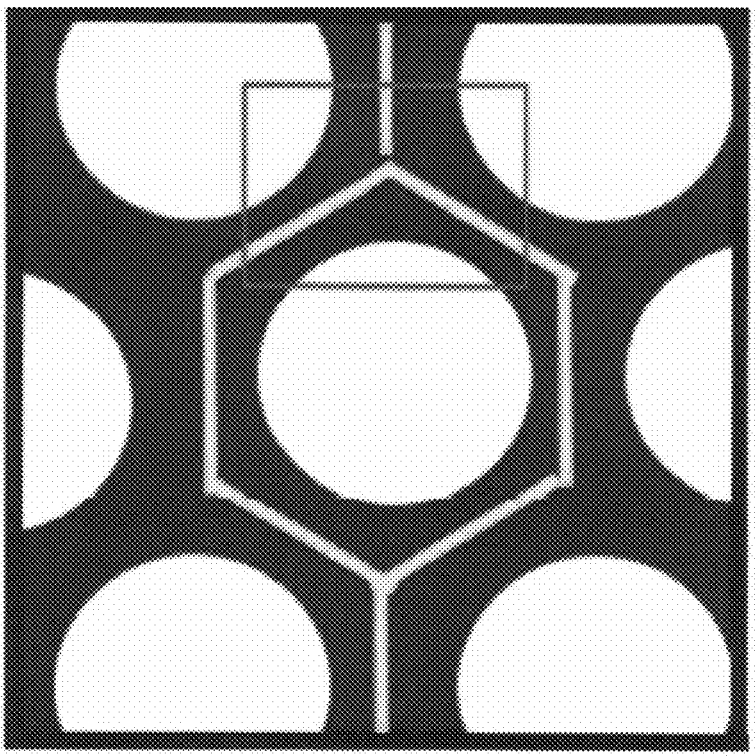
Figure 1D:
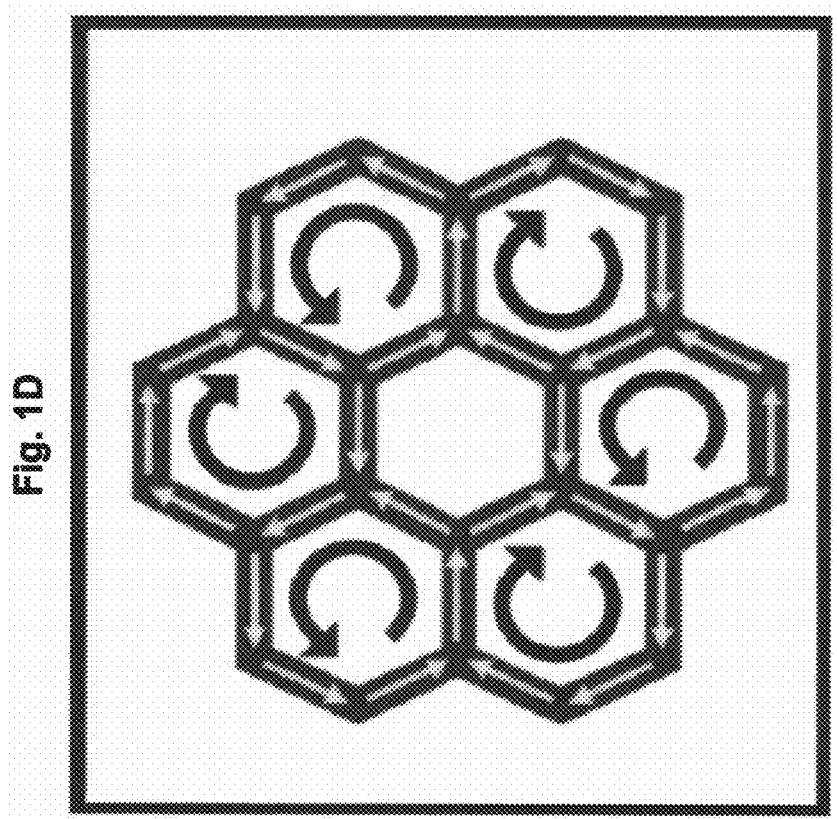
Figure 1C:
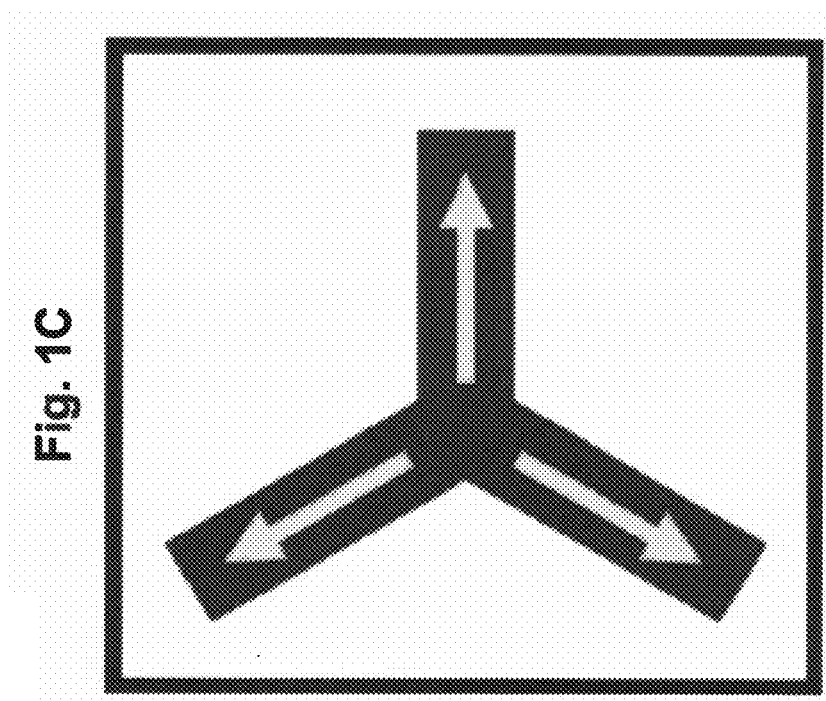
Figure 1F:
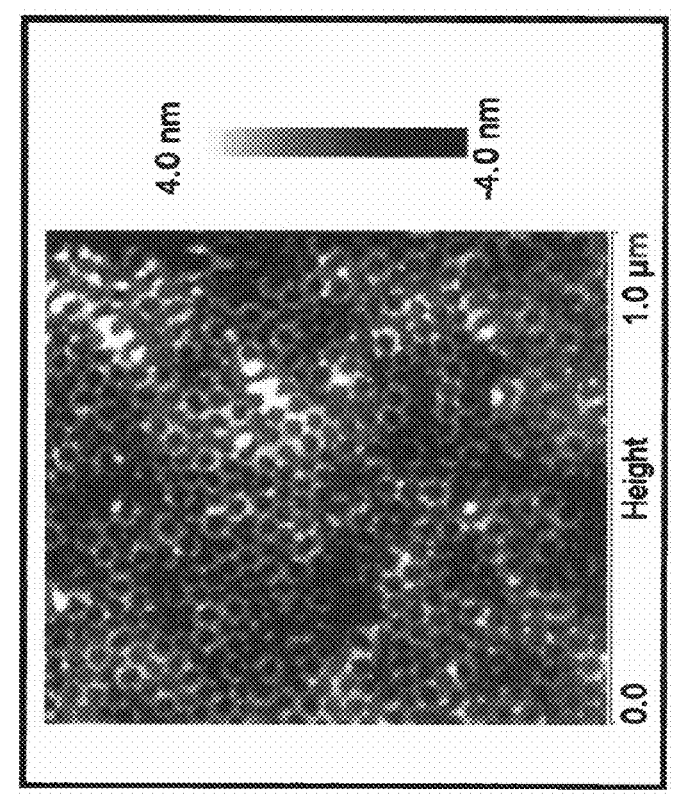
FIGS. 1E and 1F are atomic force micrographs.

The present invention involves an alternative approach to reduce the inter-elemental energy between the honeycomb bonds by preparing a disconnected honeycomb structure, wherein the magnetic elements are very thin and well well-separated.

In particular, one embodiment of the present invention is directed to a new nanofabrication scheme that allows for the creation of a macroscopic-size artificial magnetic honeycomb lattice with ultra-small dimension connecting elements (e.g., in one embodiment the length, width, and thickness of the connecting elements are 12 nm, 5 nm, and 5 nm, respectively).

Using the resulting magnetic honeycomb lattice, the temperature dependence of magnetization has been determined and a near zero magnetization at low temperature has been observed, which suggests the occurrence of the spin solid state in the system. Further, an estimated dipolar energy on the order of about 10 K has been observed for ultra-small connecting elements of one embodiment of a magnetic honeycomb lattice. Such a small inter-elemental energy makes the adjustment of temperature feasible for exploring magnetic correlations in the artificial magnetic honeycomb lattice. Magnetic, neutron scattering and electronic measurements on such a magnetic honeycomb lattice revealed multiple magnetic regimes, which is suggestive of varying magnetic correlations, as a function of the reducing temperature.

As disclosed in more detail in the Example(s) below, a remarkable transition was observed in one embodiment at low temperature, T<30 K, in which the overall net magnetization tended to approach zero. Another interesting behavior that was observed when conducting differential conductivity measurements on a permalloy honeycomb lattice was an asymmetric current bias, analogous to the properties of a semiconductor diode, that developed at higher temperatures. In particular, the system tended to quickly develop a current bias towards colossal conductivity as the measurement temperature increased beyond the spin solid regime, T>30 K, and persisted to very high temperature of T=250 K. The one-to-one correspondence between the temperature dependent current bias and the development of magnetic correlation indicates the role of the underlying magnetism in the anomalous observation. Heretofore, such asymmetric behavior was usually only observed in semiconductor diodes albeit at a much higher current. As a result, we've coined name "magnetic diode" for certain embodiments of the magnetic artificial honeycomb lattice disclosed herein. This magnetic diode technology may be utilized to design new magnetic transistors for use in electronic equipment.

Fabricating a Macroscopic-Size Magnetic Artificial Honeycomb Lattice Having Ultra-Small Connecting Elements One method for making the above-referenced magnetic artificial honeycomb lattice comprises fabricating a macroscopic-size artificial honeycomb lattice on a substrate. Upon fabrication of the lattice on a substrate, magnetic material may be deposited on the substrate lattice thereby forming the macroscopic-size magnetic artificial honeycomb lattice having ultra-small connecting elements.

I. Fabricating a Macroscopic-Size Artificial Honeycomb Lattice on a Substrate

In one embodiment, the method of fabricating a macroscopic-size artificial honeycomb lattice having ultra-small connecting elements on a substrate comprises forming a layer of a self-assembled diblock copolymer on a surface of the substrate. The self-assembled diblock copolymer layer comprises a multiplicity of hexagonal cylindrical structures in a matrix. The hexagonal cylindrical structures at least primarily comprise one of the polymers of the diblock copolymer and the matrix at least primarily comprises the other polymer of the diblock copolymer.

A. Substrate

The substrate may be selected from any appropriate material. In one embodiment, the substrate may be an electrical insulating material such as silicon nitride ($Si_3N_4$). In another embodiment, the substrate may be a semiconductor material such as silicon, which may be in the polycrystalline form or single crystal form. In one embodiment, the substrate is a single crystal silicon wafer. It is also possible for the substrate to comprise an insulator material and a semiconductor material.

As mentioned above, the device being fabricated has macroscopic size. In one embodiment, the substrate is at least substantially planar of a desirable shape (e.g., a circular single crystal silicon wafer) having a diameter corresponding to a surface area that is in a range of about 100 $mm^2$ to about 900 $mm^2$. In another embodiment the substrate has a surface area in a range of about 225 $mm^2$ to about 400 $mm^2$).

B. Diblock Copolymer

In one embodiment, the diblock copolymer is polystyrene-b-poly-4-vinyl pyridine (PS-b-P4VP). In order to achieve the desirable dimensions disclosed in detail below, it is presently believed that the several compositional parameters of the diblock copolymer must be selected or controlled. For example, it is believed that the molecular weight of the copolymer and the volume fraction of the constituent polymers may be selected or controlled.

In one embodiment, a PS-b-P4VP diblock copolymer has a molecular weight in a range of about 23,000 to 25000 Daltons. In another embodiment, the PS-b-P4VP diblock copolymer has a molecular weight in a range of (preferably in a range of about 23,000 Daltons to about 24,000 Daltons. In yet another embodiment the PS-b-P4VP diblock copolymer has a molecular weight of about 23,000 Daltons.

In one embodiment the PS-b-P4VP diblock copolymer has a polystyrene (PS) to poly-4-vinyl pyridine volume fraction in a range of about 65%:35% to about 75%:25%. In one embodiment the PS-b-P4VP diblock copolymer has a polystyrene (PS) to poly-4-vinyl pyridine volume fraction in a range of about 67%:33% to about 72%:28%. In one embodiment the PS-b-P4VP diblock copolymer has a polystyrene (PS) to poly-4-vinyl pyridine volume fraction of about 70%:30%).

In one embodiment, a PS-b-P4VP diblock copolymer has a molecular weight in a range of about 23,000 to 25000 Daltons and a polystyrene (PS) to poly-4-vinyl pyridine volume fraction in a range of about 65%:35% to about 75%:25%. In another embodiment, the PS-b-P4VP diblock copolymer has a molecular weight in a range of (preferably in a range of about 23,000 Daltons to about 24,000 Daltons and a polystyrene (PS) to poly-4-vinyl pyridine volume fraction in a range of about 67%:33% to about 72%:28%. In yet another embodiment, the PS-b-P4VP diblock copolymer has a molecular weight of about 23,000 Daltons and a polystyrene (PS) to poly-4-vinyl pyridine volume fraction of about 70%:30%).

In alternative embodiments, any of the foregoing ranges/values for the molecular weight and volume fractions may be combined.

As indicated above, the diblock copolymer self assembles such that for a PS-b-P4VP diblock copolymer the above-described hexagonal cylindrical structures at least primarily comprise the poly-4-vinyl pyridine (P4VP) of the diblock copolymer and the matrix at least primarily comprises the polystyrene (PS) of the diblock copolymer. In another embodiment, the above-described hexagonal cylindrical structures consist essentially of the poly-4-vinyl pyridine (P4VP) of the diblock copolymer and the matrix at consists essentially of the polystyrene (PS) of the diblock copolymer (e.g., less than 10, 5, 2, or 1 vol. % of the hexagonal cylindrical structures is something other than the P4VP constituent of the diblock copolymer and less than 10, 5, 2, or 1 vol. % of the matrix is something other than the PS of the diblock copolymer). In another embodiment, the above-described hexagonal cylindrical structures consist of the poly-4-vinyl pyridine (P4VP) of the diblock copolymer and the matrix at consists of the polystyrene (PS) of the diblock copolymer.

C. Forming the Layer of the Self-Assembled Diblock Copolymer on the Surface of the Substrate The forming of the layer of the self-assembled diblock copolymer on the surface of the substrate may be accomplished via any appropriate process. One such process is spin coating. It is preferable to spin coat the diblock copolymer in the form of a polymer solution that comprises the diblock copolymer and a solvent. In one embodiment, the polymer solution comprises an amount of the diblock copolymer in a range of about 0.55 vol. % to about 0.65 vol. %. In another embodiment, the polymer solution comprises an amount of the diblock copolymer in a range of about 0.57 vol. % to about 0.63 vol. %. In yet another embodiment, the polymer solution comprises an amount of the diblock copolymer of about 0.6 vol. %. The concentration of the solution is largely a function of the operational speed range of the spin coater and a change in concentration may be adjusted by a change in spin speed and vice versa.

It is desirable for the polymer solution to be thoroughly mixed. To ensure thorough mixing, one may heat the solution (e.g., 60-70° C.) to ensure that the diblock copolymer, which may be solid at lower temperatures, is adequately dissolved into the solvent while mixing (e.g., for about 1.5 hours).

The spin coat process results in evaporation of much, if not substantially all, of the solvent leaving a layer of diblock copolymer on the surface of the substrate. In one embodiment, the spin coating process is conducted so that said layer of diblock copolymer has an average thickness in a range of about 30 nm to about 40 nm. In another embodiment, the layer of diblock copolymer has an average thickness in a range of about 34 nm to about 36 nm.

In addition to the molecular weight and volume fraction of the polymer constituents, the thickness of the deposited copolymer layer contributes the final ordering and pattern of the honeycomb. If deposited in the foregoing ranges, the PS-b-P4VP diblock copolymer self-assembles (see below) into a honeycomb pattern. Whereas, it has been observed that if the thickness is outside of the about 30 nm to 40 nm range (thinner or thicker), the self-assembled cylinders tend to lay down instead of remaining vertical thereby producing lamella patterns in the layer instead of the honeycomb pattern.

In one embodiment, surface area of the layer of the diblock copolymer corresponds to that of the substrate. So that in one such embodiment, the layer of the diblock copolymer has a surface area that is in a range of about 100 $mm^2$ to about 900 $mm^2$. In another embodiment, the layer of the diblock copolymer has a surface area that is in a range of about 225 $mm^2$ to about 400 $mm^2$.

After being deposited, the layer of diblock copolymer is dried to allow the diblock copolymer to self-assemble into a honeycomb pattern. The drying may be accomplished by any appropriate manner (e.g., placing the coated substrate in a vacuum chamber for a sufficient duration such as 12 hours).

The dried polymer layer is annealed to harden the ordered diblock copolymer thereby significantly decreasing or halting the mobility of the constituent polymers. The annealing may be accomplished by any appropriate manner. For example, the annealing may be accomplished by exposing the dried polymer layer to an annealing solvent vapor that hardens the diblock copolymer. For PS-b-P4VP diblock copolymer, an appropriate annealing solvent vapor is tetrahydrofuran (THF)/toluene at 80/20 v/v conducted, for example, at 25° C. for 12 hours.

The resulting annealed layer of the self-assembled diblock copolymer has a surface area that is in a range of about 100 $mm^2$ to about 900 $mm^2$ or in a range of about 225 $mm^2$ to about 400 $mm^2$ with a thickness in a range of about 30 nm to about 40 nm or in a range of about 34 nm to about 36 nm. The annealed layer will comprise hexagonal structures within the matrix. In one embodiment, the hexagonal cylindrical structures have widths that are substantially uniform and an average width that is in a range of about 15 nm to about 20 nm. Also, the hexagonal cylindrical structures are substantially equispaced and an average center-to-center distance that is in a range of about 25 nm to about 35 nm.

Additionally, it is preferable that each hexagonal cylindrical structure, except for those at or near the outer edge of the layer, have six immediately adjacent surrounding hexagonal cylindrical structures, and imaginary lines between the center of each such hexagonal cylindrical structure and the centers of its surrounding six hexagonal cylindrical structures are substantially evenly spaced at about 60° angles between adjacent lines. When this arrangement of the hexagonal cylindrical structures is substantially uniform across a significant portion or the entirety of the layer without extra or missing the hexagonal cylindrical structures such that the imaginary lines between a multiplicity of adjacent structures along a particular 60° direction are, when combined, substantially linear/straight over significant distances (i.e., macroscopic distance on the order of millimeters). This aspect may be referred to as the "repeatability" of the honeycomb pattern or the entirety may be referred to as a "repeating" honeycomb pattern.

The matrix comprises a multiplicity of matrix connecting elements having lengths that are substantially uniform and an average length that is in a range of about 10 nm to about 15 nm. In another embodiment the average length of the connecting elements is in a range of about 12 nm to about 14 nm. In yet another embodiment the average length of the connecting elements is in a range of about 12 nm to about 13 nm). In one embodiment widths of the connecting elements are substantially uniform and the average width of the connecting elements is in a range of about 4 nm to about 8 nm. In another embodiment the average width of the connecting elements is in a range of about 4 nm to about 6 nm.

Due to having the above-described substantially uniform dimensions for the hexagonal cylindrical structures and matrix connecting elements (e.g., a maximum variability for each dimension of no more than about ±20%, 15%, 10%, 5%, or less) and the above-described the repeatability of the honeycomb pattern, the honeycomb lattice is considered to have "good order."

D. Separating the Hexagonal Cylindrical Structures from the Matrix

The annealed layer is subsequently treated to separate the hexagonal cylindrical structures from the matrix on the substrate surface to expose portions of the substrate surface corresponding to the hexagonal cylindrical structures. In one embodiment, this separation is accomplished by contacting the layer of the self-assembled diblock copolymer on the surface of the substrate with a compound that breaks the bonds between the two copolymers thereby (e.g., ethanol, and/or methanol) thereby releasing the hexagonal cylindrical structures from the matrix, and washing away the released hexagonal cylindrical structures from the substrate surface.

E. Patterning the Substrate

The substrate may be patterned by removing material from the exposed portions of the substrate surface thereby forming the artificial honeycomb lattice on the substrate, wherein the artificial honeycomb lattice comprises a multiplicity of connecting elements separated by hexagonal cylindrical pores. The hexagonal cylindrical pores have widths and center-to-center distances and repeatability corresponding to the widths and center-to-center distances and repeatability of the hexagonal cylindrical structures of the layer of the self-assembled diblock copolymer and depths extending inward from the surface of the substrate that are substantially uniform and an average depth that is in a range of about 5 nm to about 10 nm. In another embodiment, the average depth is in a range of about 8 nm to about 10 nm. Additionally, the lattice connecting elements have lengths and widths corresponding to that of the matrix connecting elements and heights corresponding to the depths of the hexagonal cylindrical pores.

The removing of material from the exposed portions of the substrate surface may be accomplished by any appropriate manner. For example, for a silicon wafer reactive ion etching using suing $CF_4$ is appropriate. In one embodiment, this etching is done using 40-50 Watts forward power and CF4 at a pressure of 100 microns of Hg for 15 seconds.

Substrate Comprising an Artificial Honeycomb Lattice Topography

The resulting patterned substrate comprises an artificial honeycomb lattice topography, wherein the artificial lattice topography is over a surface area of the substrate that is in a range of about 100 $mm^2$ to about 900 $mm^2$ or in a range of about 225 $mm^2$ to about 400 $mm^2$. The artificial lattice topography comprises a multiplicity of connecting elements separated by hexagonal cylindrical pores. The hexagonal cylindrical pores have widths that are substantially uniform and an average width that is in a range of about 15 nm to about 20 nm, are substantially equispaced and have an average center-to-center distance that is in a range of about 25 nm to about 35 nm; and have depths extending inward from the surface of the substrate that are substantially uniform and an average depth that is in a range of about 5 nm to about 10 nm or in a range of about 8 nm to about 10 nm. The connecting elements have lengths that are substantially uniform and an average length that is in a range of about 10 nm to about 15 nm or in a range of about 12 nm to about 14 nm or in a range of about 12 nm to about 13 nm, widths that are substantially uniform and an average width that is in a range of about 4 nm to about 8 nm or in a range of about 4 nm to about 6 nm, and heights that are substantially uniform corresponding to the depths of the hexagonal cylindrical pores.

Depositing Magnetic Material on the Artificial Honeycomb Lattice Topography of the Substrate The method of making the magnetic artificial honeycomb lattice, comprises depositing a layer of magnetic material on substantially only the uppermost surfaces of the connecting elements of the artificial honeycomb lattice topography of the above described substrate, wherein the magnetic material layer has a thickness that is substantially uniform and an average thickness that is in a range of about 2 nm to about 8 nm in one embodiment. In another embodiment, the average thickness is in a range of about 4 nm to about 7 nm. In yet another embodiment, the average thickness is in a range of about 4.5 nm to about 6.5 nm.

In one embodiment, the average length of the connecting elements of the artificial honeycomb lattice (l) and the average thickness of the magnetic layer (t) are at an aspect ratio of l/t that is in a range of about 1.25 to about 7.5. In another embodiment, the aspect ratio of l/t that is in a range of about 2 to about 3.

In one embodiment, the magnetic material is selected from the group consisting of nickel, iron, cobalt, molybdenum, one or more Permalloy alloys, and combinations or mixtures, or alloys thereof. In one embodiment, the substrate is a single crystal silicon wafer and the magnetic material is an alloy comprising nickel and iron. In another embodiment, the substrate is a single crystal silicon wafer and the magnetic material is a Permalloy comprising 80% Ni, 14.48% Fe, 5% Mo, 0.5% Si, and 0.02% Cu.

The layer of magnetic material may be deposited by any appropriate method. One method for ensuring that the magnetic material is deposited substantially only the uppermost surfaces of the connecting elements of the artificial honey comb lattice topography of the substrate comprises depositing the magnetic material from a surface of an evaporation source via electron-beam evaporation, wherein the uppermost surfaces of the connecting elements are maintained in a near parallel orientation relative to a direction perpendicular to the surface of the evaporation source (e.g., no greater than 2° angle) while the substrate is rotated about a central axis at a substantially constant rate. In another embodiment the near parallel orientation comprises an angle between the perpendicular direction and the uppermost surfaces of the connecting elements of the artificial honey comb lattice topography that is in a range of about 1° to about 2°.

In one embodiment, the method further comprises depositing (e.g., in the same or similar manner) a layer of non-magnetic, protective material on the layer of the magnetic material to prevent or limit oxidation or other corrosion of the magnetic material.

Magnetic Artificial Honeycomb Lattice

In certain embodiments, the present invention is directed to a magnetic artificial honeycomb lattice comprising a multiplicity of connecting elements separated by hexagonal cylindrical pores. The hexagonal cylindrical pores have widths that are substantially uniform and an average width that is in a range of about 15 nm to about 20 nm, and are substantially equispaced and have an average center-to-center distance that is in a range of about 25 nm to about 35 nm. The connecting elements comprise a magnetic material layer, and the connecting elements have lengths that are substantially uniform and an average length that is in a range of about 10 nm to about 15 nm or in a range of about 12 nm to about 14 nm or in a range of about 12 nm to about 13 nm. The connecting elements have widths that are substantially uniform and an average width that is in a range of about 4 nm to about 8 nm or in a range of about 4 nm to about 6 nm. The connecting elements have a thickness of the magnetic material layer that is substantially uniform and an average thickness that is in a range of about 2 nm to about 8 nm or in a range of about 4 nm to about 7 nm or in a range of about 4.5 nm to about 6.5 nm. Additionally, the magnetic artificial honeycomb lattice has a surface area, disregarding the presence of the hexagonal cylindrical pores, that is in a range in a range of about 100 $mm^2$ to about 900 $mm^2$ or in a range of about 225 $mm^2$ to about 400 $mm^2$.

In one embodiment, the average length of the connecting elements (l) and the average thickness of the magnetic material layer of the connecting element (t) are at an aspect ratio of l/t that is in a range of about 1.25 to about 7.5. In another embodiment the aspect ratio of l/t is in a range of about 2 to about 3.

In one embodiment, the magnetic artificial honeycomb lattice exhibits asymmetric differential electrical conductance (or unidirectional electronic transport) without application of magnetic field when at a temperature in a range of about 60 K to about 300 K and subjected to a current in a range of about 15 μA to about −15 μA, wherein the conductance increases by at least two orders of magnitude for one current bias compared to a zero bias. In another embodiment, the temperature of the magnetic artificial honeycomb lattice is in a range of about 150 K to about 275 K. In yet another embodiment, the temperature of the magnetic artificial honeycomb lattice is in a range of about 200 K to about 250 K.

In another embodiment, the connecting elements further comprise a layer of non-magnetic, protective material on the magnetic material layer to prevent or limit oxidation or other corrosion of the magnetic material.

Adjusting the Degree of the Asymmetric Differential Electrical Conductance of the Magnetic Artificial Honeycomb Lattice One embodiment of the present invention is directed to a method of adjusting the degree of the asymmetric differential electrical conductance (or unidirectional electronic transport) of the above-described embodiments of the magnetic artificial honeycomb lattice without varying the amount of current or the current bias, the method comprising: (a) varying the temperature of the magnetic artificial honeycomb lattice; (b) applying a magnetic field to the magnetic artificial honeycomb lattice; or (c) both (a) and (b).

Example 1

Sample Fabrication

Figure 1E:
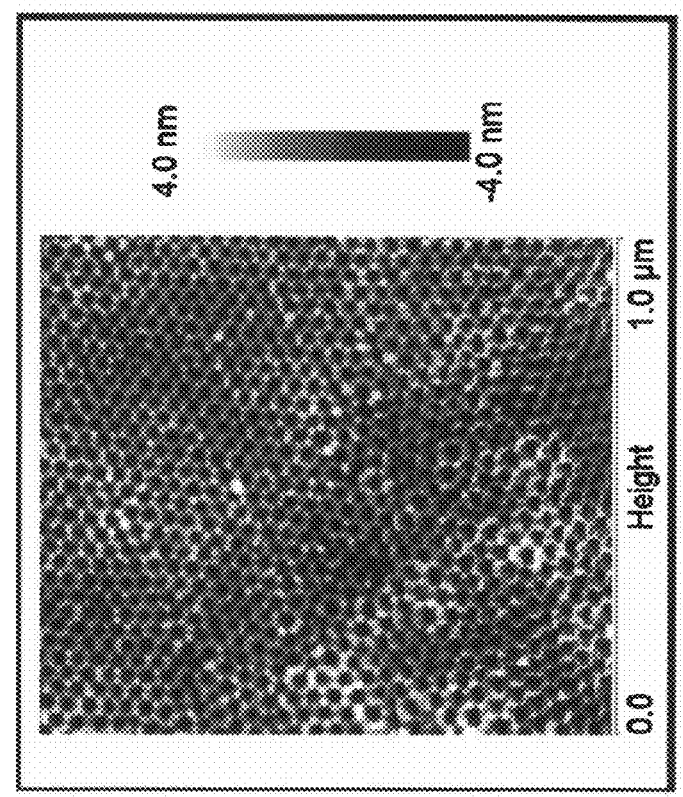
Figure 2:
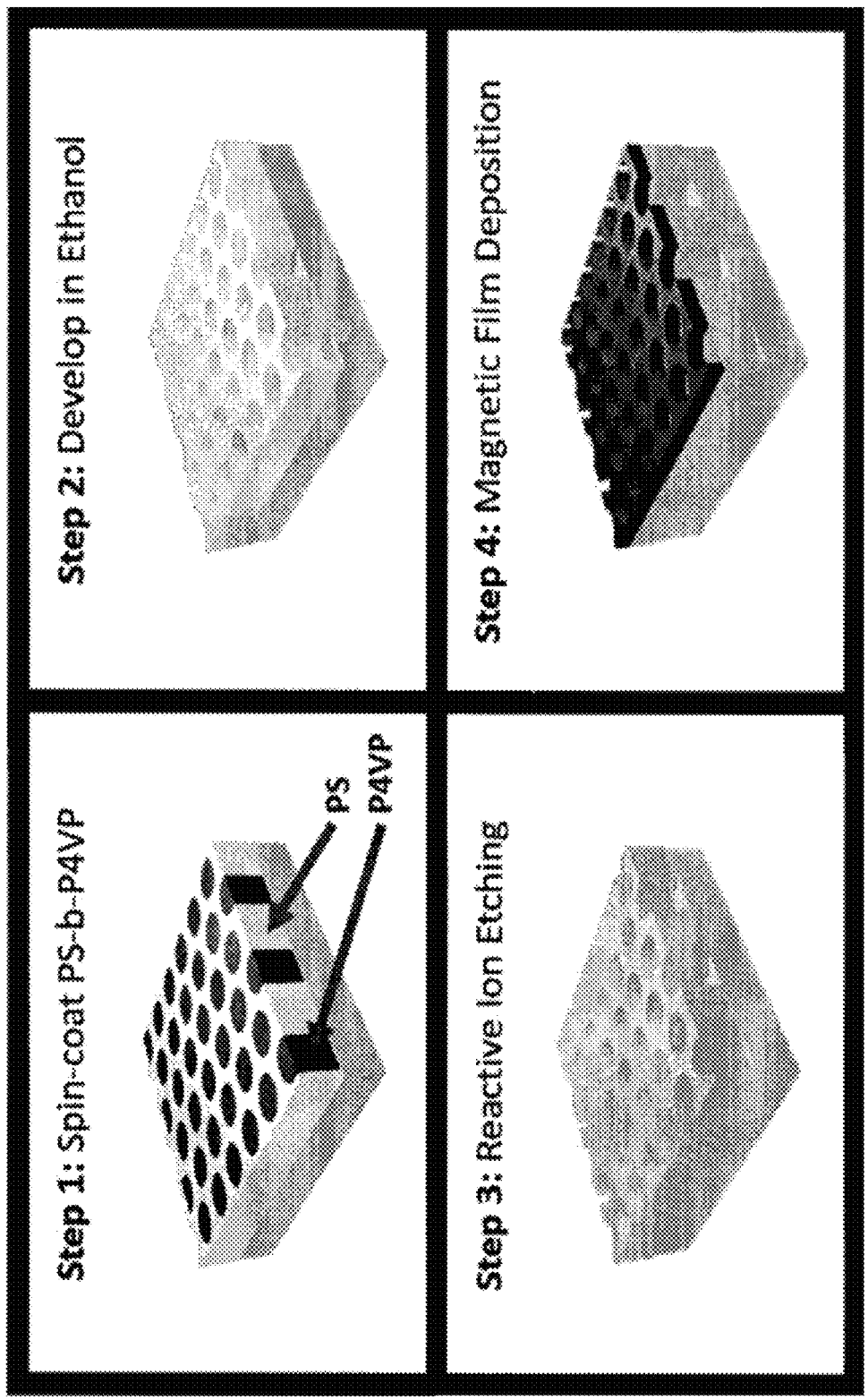
FIG. 2 is depicts step-by-step illustrations of a fabrication process utilizing the self-assembly of diblock copolymer, PS-b-P4VP. Step 1: the diblock film after being spun onto Si wafer, dried in vacuum, and annealed. Step 2: developing the sample in ethanol cuts the ties between the two polymer and allows the P4VP cylinders to release from sample surface leaving PS matrix in honeycomb pattern. Step 3: KW etches down into the substrate to transfer the pattern in Si substrate. Step 4: Using the near parallel deposition method in an electron-beam evaporator, we were able to deposit magnetic materials on top of the honeycomb pattern only.
Figure 3:
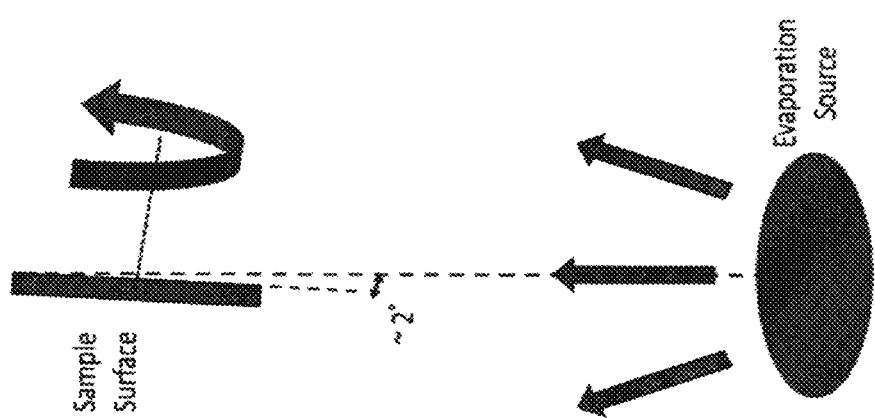
FIG. 3 is a schematic illustration of an angled deposition setup for evaporating a metal on honeycomb surface, wherein the sample surface is at a glancing angle of 1-2° with respect to the source, and the sample is rotated a constant rate about its axis to create a uniform thickness across the lattice.

The sample fabrication process utilized diblock copolymer polystyrene(PS)-b-poly-4-vinyl pyridine (P4VP) of molecular weight 23 k Dalton with the volume fraction of 70% PS and 30% P4VP. At this volume fraction, the diblock copolymer tends to self-assemble in a hexagonal cylindrical structure of P4VP in the matrix of polystyrene. A 0.5% PS-b-P4VP copolymer solution in toluene was placed in a heat bath at 60° C. for 1.5 hours and stored in a standard refrigerator. The solvent was spin coated onto cleaned silicon wafers at 2500 rpm for 30 s and placed in vacuum for 12 hours to dry. The samples were solvent annealed at 25° C. for 12 hours in a mixture of THE/toluene (80:20 v/v) environment. The process results in the self-assembly of P4VP cylinders in a hexagonal pattern within a PS matrix, as shown schematically in Step 1 of FIG. 2. Submerging the samples in ethanol for 20 minutes releases the P4VP cylinders yielding a porous hexagonal template as shown in Step 2 of FIG. 2. The nanoporous template exhibits a typical pore diameter of ≃12 nm and the center-to-center lattice spacing of 26 nm. Reactive ion etching with $CF_4$ gas was performed to transfer the hexagonal pattern to the silicon substrate as shown in Step 3 of FIG. 2. The top layer of the substrate resembles a honeycomb lattice pattern. FIG. 1(e) is an atomic force micrograph of the resulting hexagonal structure in silicon substrate. The top layer of the hexagonal substrate depicts a honeycomb pattern. This property is exploited to create a two-dimensional metallic honeycomb lattice of the ultra-small bond. This topographical property is exploited to create metallic honeycomb lattice by depositing permalloy, $Ni_{08}Fe_{0.2}$, in near parallel configuration in an electron-beam evaporation. The substrate was rotated uniformly about its axis during the deposition to create uniformity, as illustrated in FIG. 3. This allowed evaporated permalloy to coat the top surface of the honeycomb only, producing the desired magnetic honeycomb lattice as shown in Step 4 of FIG. 2. FIG. 1 (f) shows an AFM image of the metallic honeycomb lattice.

The honeycomb samples were preserved in vacuum environment to reduce the exposure to air.

Magnetic Measurements and Neutron Scattering Measurements

Magnetic measurements were performed using a QD MPMS on a 5 mm×5 mm size sample.

Magnetic Measurements on the Honeycomb Lattice in Perpendicular Field Application:

Magnetic measurements were also performed for the perpendicular field application direction to the plane of the sample. As shown below in FIG. 5, no significant difference between the ZFC and the FC curve is observed for the perpendicular field application. This behavior is not surprising as the thickness of the honeycomb film is very small (~5 nm). It will not be energetically feasible for the magnetic moment, aligned along the connecting bond direction, to cant out of plane. Therefore, the perpendicular direction acts as the hard axis for the magnetization reversal.

Figure 10:
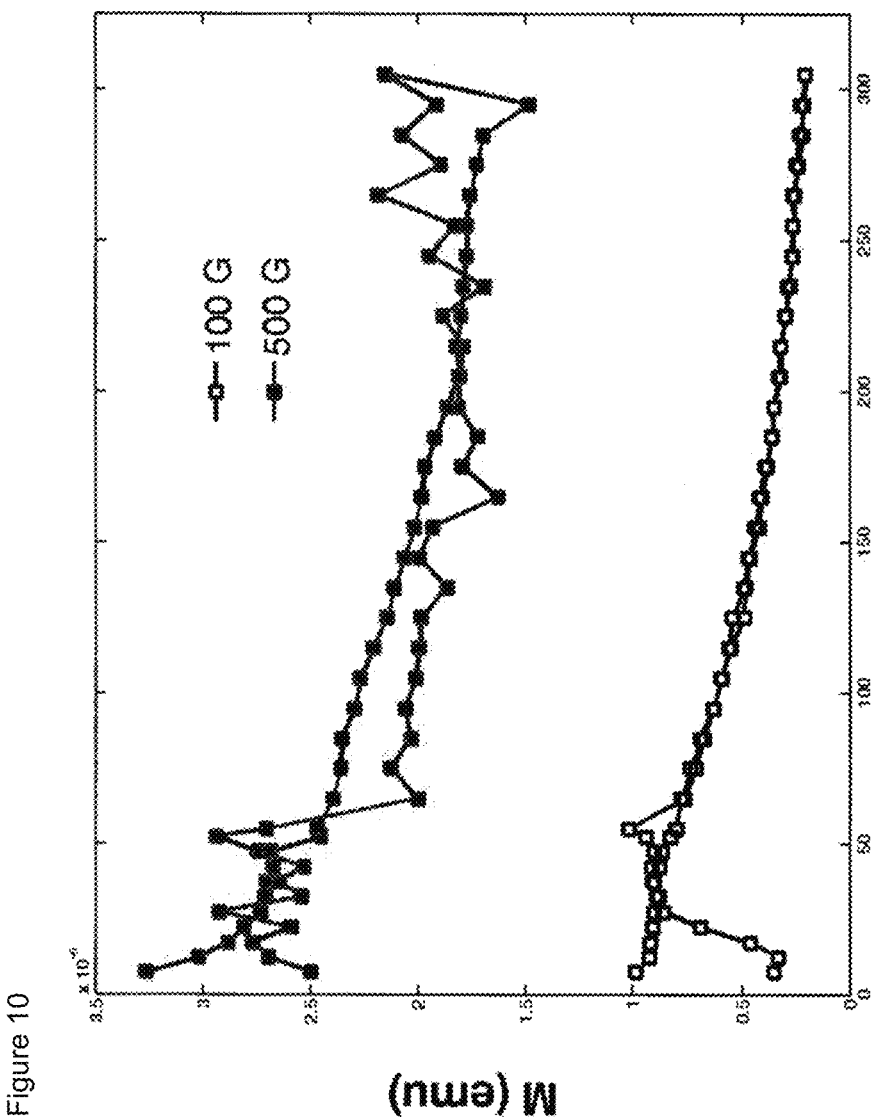
FIG. 10 shows magnetic measurements on permalloy thin films of different thicknesses.

Magnetic Measurements on Thin Permalloy Film:

In addition to the magnetic measurements on permalloy honeycomb lattice, measurements were also performed on plain thin film of permalloy. As shown in FIG. 10, the magnetization data in the M vs. T plot is clearly different from the one obtained on the honeycomb lattice (FIG. 4).

Figure 7:
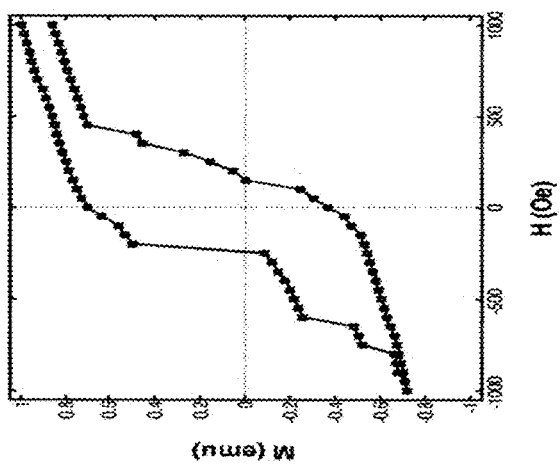
FIG. 7 shows a micromagnetic simulation using OOMMF software of permalloy distorted honeycomb.
Figure 7:
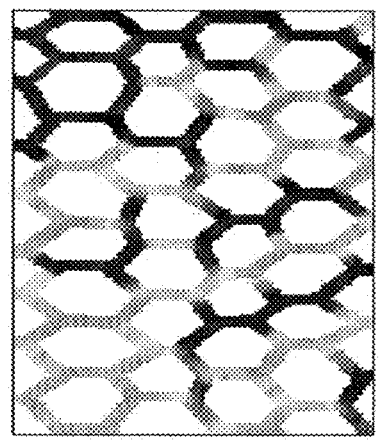

Micromagnetic Simulation of the Artificial Honeycomb Lattice with Distorted Bond Structure:

The micromagnetic simulations were also performed for the honeycomb lattice with distorted bond lengths, varying between 10-15 run in length, 4-7 nm in width and 4-7 nm in thickness, to understand the role of the quenched disorder in the newly fabricated artificial honeycomb lattice system. As shown in FIG. 7, the magnetic hysteresis loop and the associated magnetization profiles do not seem to be affected due to the presence of disorder in the connecting bonds.

Magnetometry is a key macroscopic probe to obtain information about the static and dynamic magnetic properties of a system as functions of temperature and field. The macroscopic size of the newly designed artificial honeycomb lattice is well suited for investigation using this measurement technique. We performed detailed magnetic measurements on the recently fabricated artificial honeycomb lattice of connecting permalloy ($Ni_{0.8}Fe_{0.2}$) bonds. Magnetic field was applied along an in-plane direction to the sample. As shown in FIG. 2a, the ZFC (zero field cool)/FC (field cool) curves of M vs. T measurements depict the temperature dependence with multiple magnetic regimes in the honeycomb lattice. At T>300 K, the system is a paramagnetic gas (spin gas). As temperature is reduced, the system crosses over into a weak magnetic ordered state at T about 250 K, indicated by small downward cusp in the low field data (also see the inset in FIG. 4(a)). For further decrease in temperature below T=100 K, another small downward cusp-indicating a new magnetic regime is detected. As the applied field increases, the irreversibility between the FC and ZFC curves gradually shifts to lower temperature, before disappearing at H≥500 Oe. The strong sensitivity of various magnetic correlation regimes to the applied field is also consistent with previous observation of the field-induced avalanche effect in the large element size artificial honeycomb lattice, where the field application tend to destroy the delicate short-range spin ice order due to 2-in & 1-out (or vice-versa) magnetic configuration.

Figure 5B:
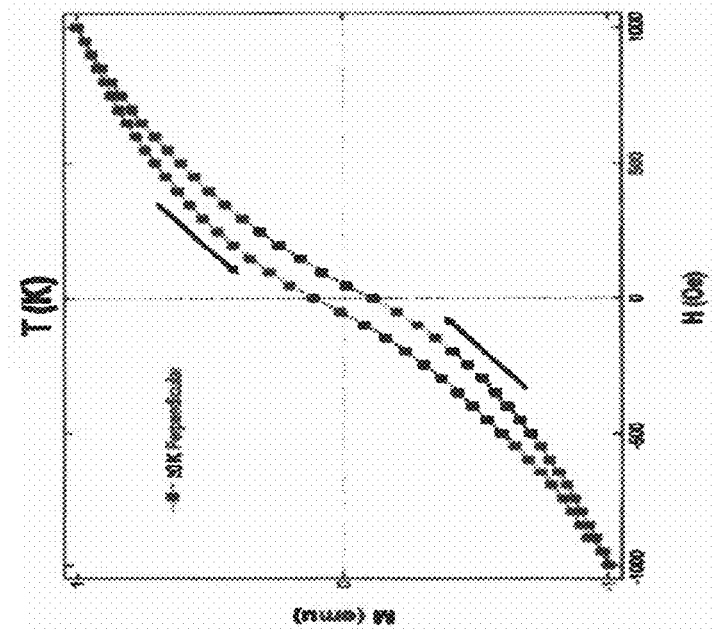
FIGS. 5A and 5B show MPMS measurements in perpendicular orientation. Magnetic field is applied perpendicular to the substrate.
Figure 5A:
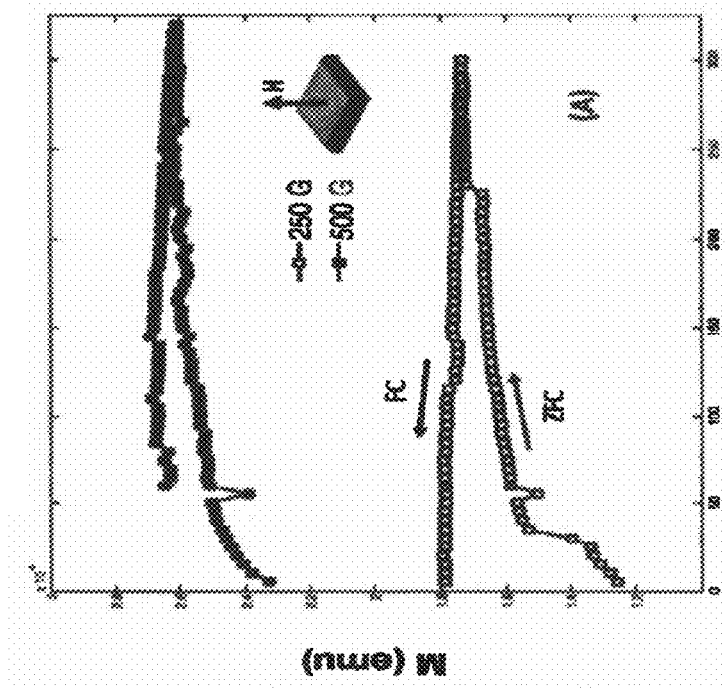

The temperature dependent magnetization curves exhibit a tendency to attend the zero magnetization state (see ZFC curves) at temperature below T=30 K. This behavior becomes more apparent at higher magnetic field. For instance, at H=500 Oe, the net magnetization of the honeycomb lattice reduces rapidly towards zero value at T<30 K from the large saturation value. This behavior is only observed in the zero field cool measurement, i.e., when the sample is cooled to the base temperature in zero magnetic field. Thus, the system develops the near zero magnetization state in the "absence" of magnetic field. As soon as a magnetic field is applied, the correlated moments tend to abandon that delicate zero magnetization state. When cooled back in applied field (as small as H=25 Oe), the moments re-main locked in to the field-aligned value. The lock-in temperature reduces with increasing magnetic field. The near zero magnetization state is most likely arising due to the development of the spin solid state at low temperature in the system, also predicted by recent theoretical research works. In the spin solid state, the magnetic moments along the connecting elements of the honeycomb lattice form vortex states of opposite chirality (see FIG. 1(a)). As a result, the system manifests zero magnetization in the spin solid state. Our efforts of accessing the net zero magnetization state in the newly fabricated permalloy honeycomb lattice was hampered by the technical limitation of the present SQUID magnetometer, which could not be cooled below T=5 K. Nonetheless, the trend towards zero moment as T→0 K is apparent in the ZFC curve of the magnetization data. Magnetic measurements were also performed for the perpendicular field application to the sample plane. As shown in FIG. 5, no appreciable change in the magnetization pattern of ZFC and FC curves were detected for the perpendicular field application. This behavior is not surprising for such a thin (about 5 nm) honeycomb film. The perpendicular direction acts as the hard axis for the magnetization reversal to take place.

Figure 4B:
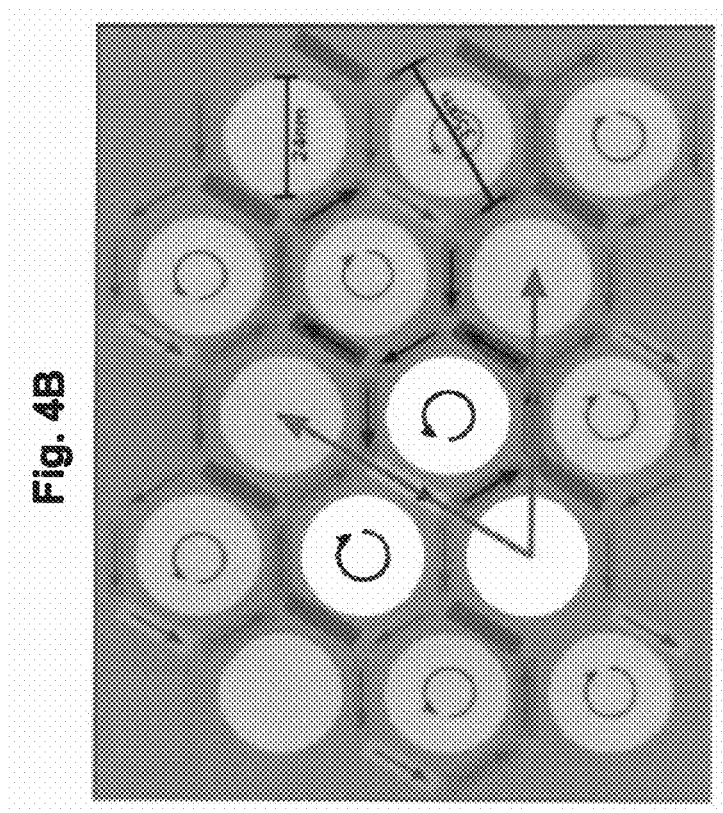
FIGS. 4A, 4B, 4C, and 4D show in-plane magnetic measurements and polarized off-specular neutron reflectometry data.
Figure 4A:
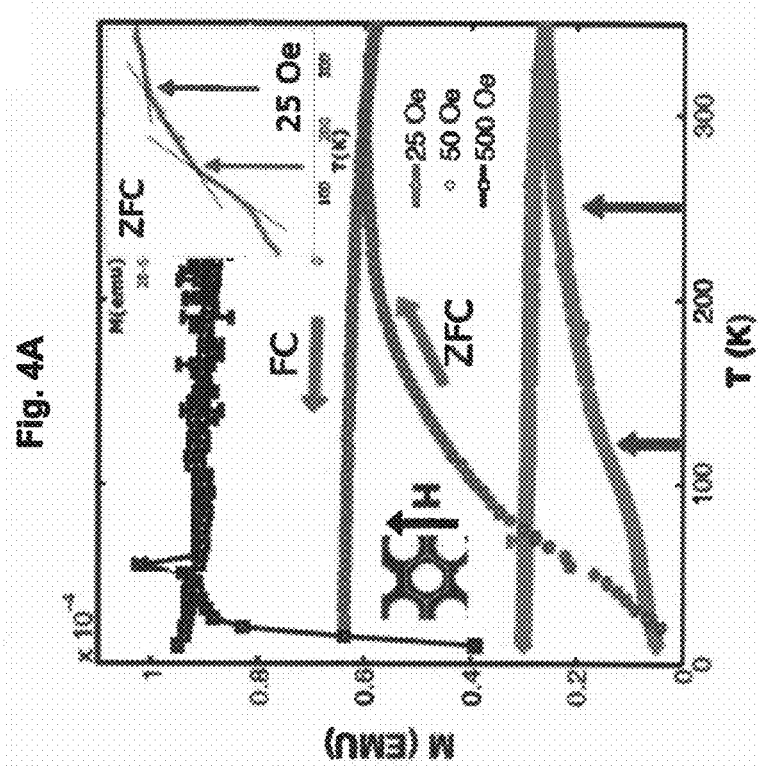
Figure 4D:
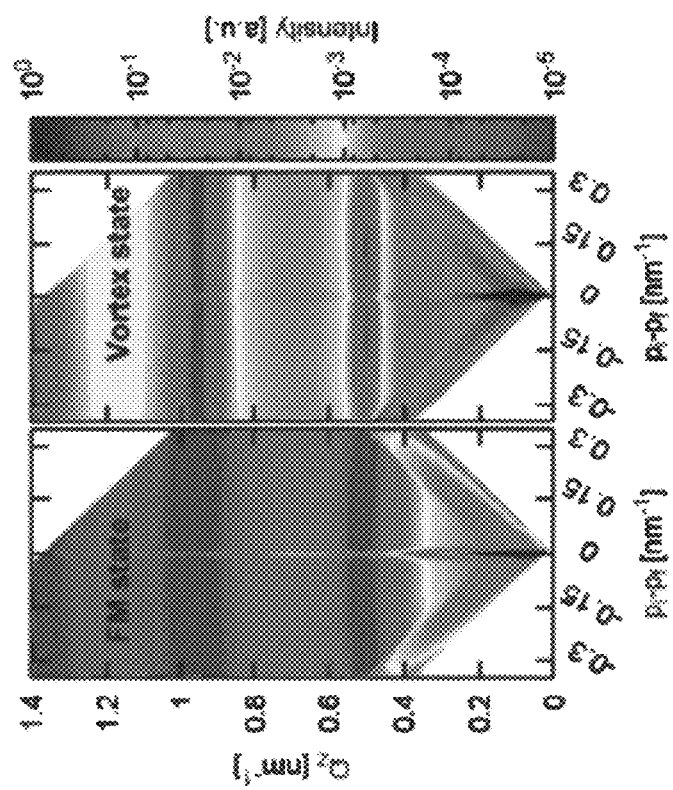
Figure 4C:
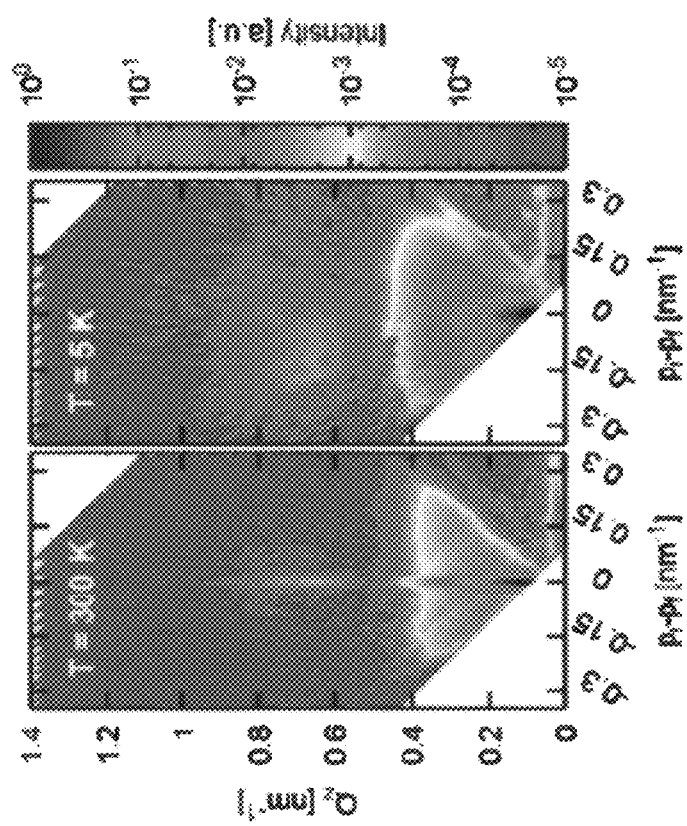

In order to gain more insight in the evolution of the spin solid state at low temperature, we have also per-formed polarized neutron experiments, namely reflectometry (PNR) and off-specular scattering. The off-specular measurements allow us to understand the development of the in-plane magnetic structure as a function of temperature in the system. In FIG. 4c, we plot the off-specular data in the spin up polarization channel at T=300K and 5K where the vertical direction corresponds to the out-of-plane correlation and the horizontal to the in-plane correlation. The vertical line across the origin represents the specular reflectivity. The measurement at T=300 K already exhibits significant intensity in the specular data, as is typical for most samples and can be expected due to the saturated honeycomb structure with no inplane magnetic contrast. Upon cooling to T=5 K, the off-specular signal increases significantly (notice the logarithmic color scale). Also, no specular beam can be distinguished from the off-specular background and the difference between the spin-up and the spin-down component vanishes. As the nuclear structure will not change significantly upon cooling, this can only be explained by a significant change in the magnetic order. The signal itself is very flat along the x-direction, suggesting the development of an in-plane magnetic correlation. Numerical simulation of the scattering profile, see FIG. 4d, using a vortex magnetic configuration of the spin solid state, as shown in FIG. 4b, reproduces essential features of the experimental data, such as the band of broad scattering along the horizontal direction and an almost negligible specular reflection. It further confirms that the system tends to develop a spin solid state at low temperature.

Figure 6:
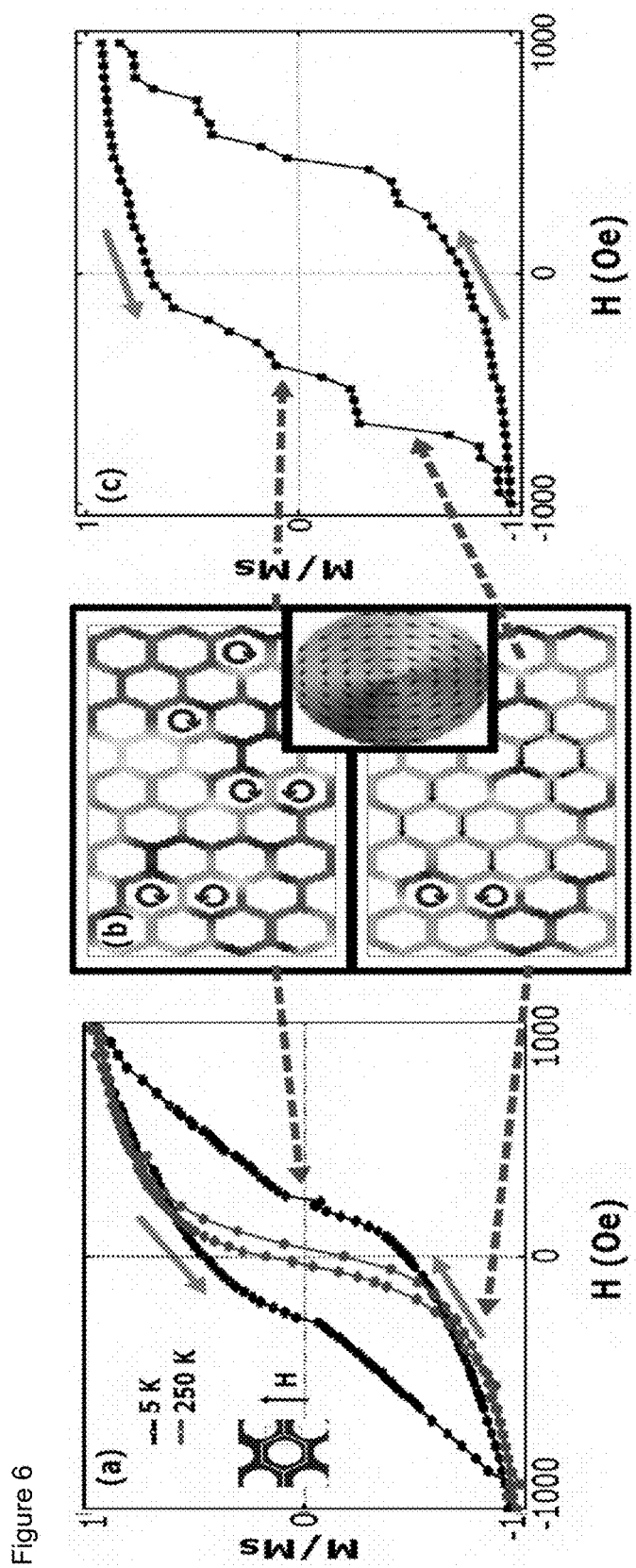
FIG. 6 shows Magnetic measurements in applied magnetic field and micromagnetic simulation results of permalloy honeycomb lattice. M vs. H measurements at two different temperatures. Magnetic field was applied in-plane to the sample. Experimental data is compared with micromagnetic simulation. Near zero field, the artificial honeycomb lattice exhibits 2-in & 1-out spin ice structure. As the field is reduced, pair of chiral vortexes arise as highlighted by the arrow. The magnetic hysteresis loop obtained from micromagnetic simulation agrees well with the experimental data. The micromagnetic simulation was performed using 0.2×0.2 $nm^2$ mess size, with magnetic field applied in-plane to the lattice.

The occurrence of the spin solid state is further investigated using magnetic hysteresis measurements at low temperature. In FIG. 6a, we plot M vs H data at two characteristic temperatures of T=5 K and 250 K. Measurement at T=5 K reveals a sharp transition to a near zero magnetization state near the zero field value, which is completely absent at T=250 K. To understand this, we have performed micromagnetic simulations on artificial permalloy honeycomb lattice of similar element size and thickness by utilizing the Landau-Lifshitz-Gilbert equation of magnetization relaxation in a damped medium. The artificial honeycomb lattice was simulated using 0.2×0.2 $nm^2$ mess size on the OOMMF platform, with magnetic field applied in-plane to the lattice. The simulated magnetic hysteresis curve is shown in FIG. 6b, which depicts striking similarities with the experimental data. The magnetic correlation near zero field is found to be dominated by the distribution of the chiral vortex configurations, encompassing six vertexes of the honeycomb lattice, of opposite polarities of the spin solid state. At moderate field value, the finite magnetization in the artificial honeycomb lattice is described by the short-range spin ice correlation of 2-in & 1-out (and vice-versa) states. At sufficiently high field, the moments tend to align to the applied field direction, thus maximizing the overall magnetization of the system. These observations are consistent with the analysis of the magnetization data in FIG. 4a. The micromagnetic simulations were also performed for the honeycomb lattice with distorted bond dimensions, varying between 10-15 nm in length, 4-7 nm in width and 4-7 nm in thickness, to understand the role of the quenched disorder in the system. As shown in FIG. 7, no significant change in the magnetic hysteresis profile was detected in this case.

Electronic Measurements

Electrical measurements were performed on 8 mm×5 mm size sample using a cryogen-free 9 T magnet with a base temperature of T=4.5 K. For the electrical measurements, four probe technique with equidistant contacts was employed. Electrical resistance was measured using a high quality resistivity bridge from Linear Research, while the differential conductivity measurements were performed using a synchronized combination of Keithley current source meter 6221 and a nanovoltmeter 2182A via a trigger link. Electronic measurements involved the averaging of twenty data points where each data was filtered for 20 seconds before recording the final value. Polarized neutron scattering experiments were performed on a 1 sq. inch sample at magnetism reflectometer, beamline 4A of the Spallation Neutron Source (SNS), at Oak Ridge National Laboratory. The instrument used the time of fight technique in a horizontal scattering geometry. The beam was collimated with a set of slits before the sample and measured with a 2D position sensitive $^3$He detector. Polarization and analysis used reflective supermirror technology.

Figure 8:
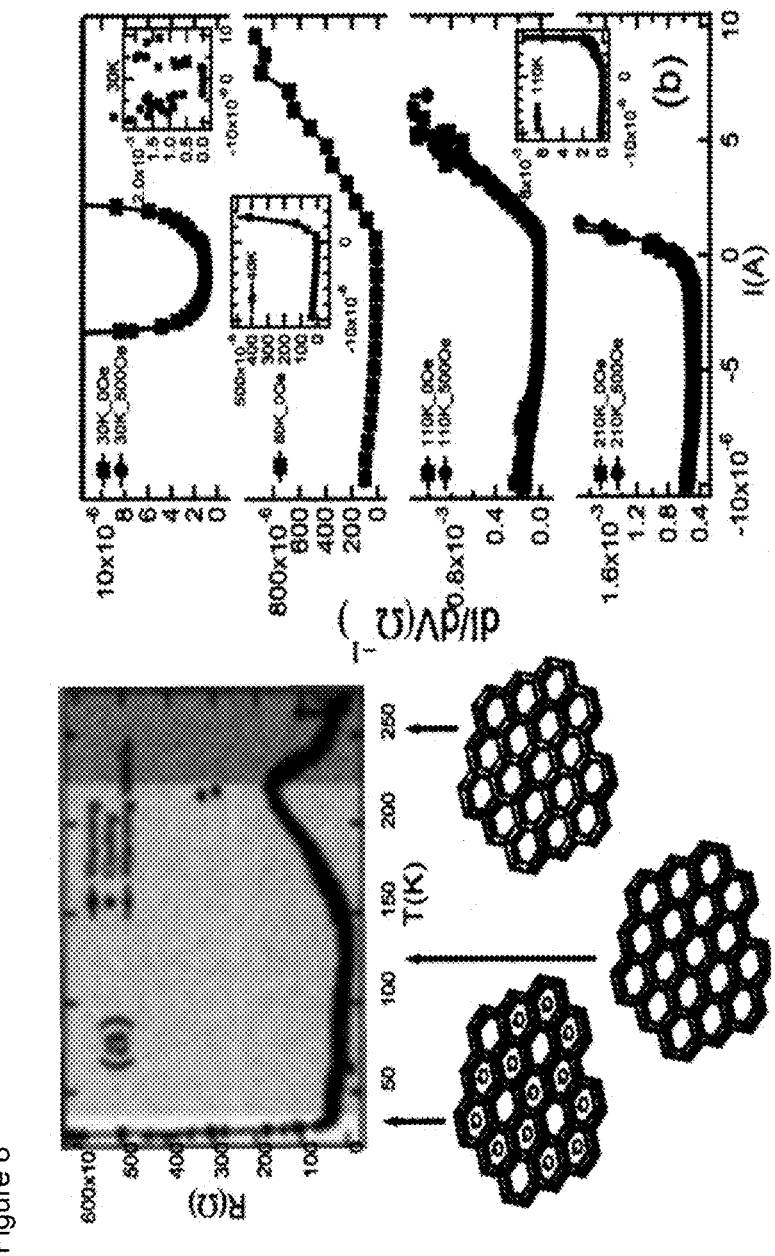
FIG. 8 shows electronic measurements of permalloy honeycomb lattice. (a) Electrical resistivity as a function of temperature at different magnetic fields are plotted in this figure. While the broad peak at T=225 K indicates the onset of a local magnetic order, the rapid increase in resistance at low temperature indicates the development of the spin solid state in the system. It is also consistent with the magnetic measurements. Different magnetic regimes, indicated by schematic spin configurations, are highlighted by different colors. (b) Differential conductivity (dI/dV) as a function of current at different temperatures are plotted in this figure. In a completely surprising observation, an asymmetric current bias resulting into a p-n junction diode-type characteristics is found to develop as measurement temperature increases. Also see FIG. 9 where electric power as a function of applied current is plotted at few characteristic temperatures. The asymmetric characteristic of the electric power of the honeycomb lattice confirms the current bias in the system.

We investigated the relation between various magnetic phases and electronic properties of artificial permalloy honeycomb lattice as functions of temperature and applied magnetic field. Previously, researchers have used electrical measurements to deduce information about temperature induced magnetic phases in disconnected honeycomb lattice where all four theoretically predicted states were argued to exist. We performed two types of measurements: electrical resistance as a function of temperature at different magnetic fields and the differential conductivity as a function of applied current at different temperatures and fields. Together, they provide a comprehensive outlook of the electrical transport properties in the newly fabricated artificial honeycomb lattice. In FIG. 8a, we plot electrical resistance as a function of temperature at different fields. Two features are immediately recognized here: a broad peak, centered around T=225 K, followed by a gradual decrease in resistance as temperature decreases, and second, a sharp increase in the electrical resistance at low temperature at T<30 K, suggesting the onset of the insulating behavior in the system. A peak in the electrical resistance data is generally ascribed to the onset of a long-range or short-range magnetic order in the system. The magnetization data in FIG. 4a further corroborates this fact where the irreversibility between the ZFC and FC curves becomes pronounced around this temperature. Similarly, the rapid increase in the electrical resistance at T<30 K is consistent with the onset of the spin solid state in the system. In the spin solid state, the chiral vortex state does not exhibit any origination or termination point. Since conduction electrons follow the magnetization configuration, applied currents become confined to the circulating vortex loops as temperature decreases and only a small fraction of the current manages to traverse as temperature decreases further due to the percolation of the chiral vortex loops across the sample. Hence, the overall electrical conductivity decreases (or resistance increases) significantly as the system approaches the spin solid regime below T<30 K. When subjected to an external field of H=500 Oe, resistance decreases because the field application starts destroying the delicate spin solid state in the system. This observation is in good agreement with magnetic and neutron scanning measurements at low temperature.

Figure 9:
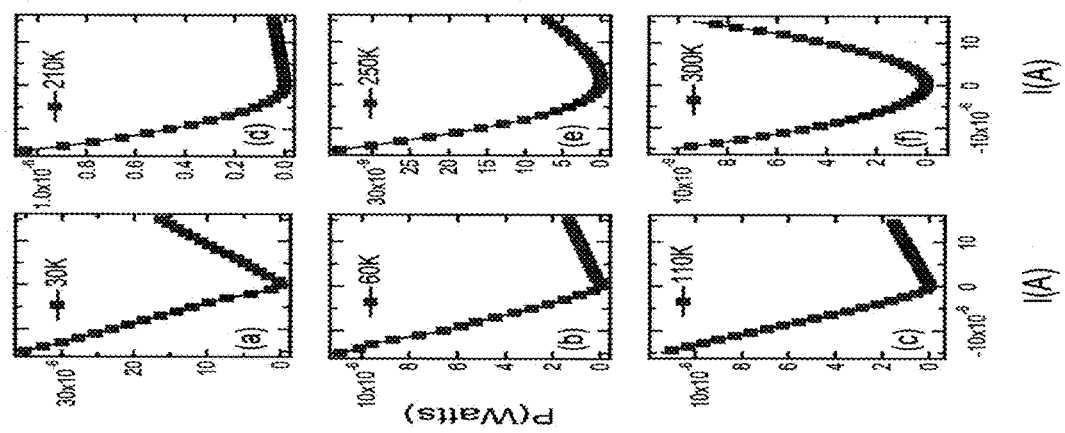
FIG. 9 shows output power vs. current measurements at various temperatures. Measurements were performed between 30 K and 300 K on the permalloy honeycomb lattice. The power measurement reflects the development of the asymmetric current bias, as shown in FIG. 8b, as a function of the applied current. The power is nearly symmetric at T~30 K. As temperature increases, it becomes asymmetric and peaks below T~250 K, before becoming completely symmetric at T=300 K, in the spin gas state of the system.

While electrical resistance measurements complement the observation of temperature dependent magnetic correlation in the newly fabricated permalloy honeycomb lattice, a much more dramatic effect is observed in the differential conductivity measurements in zero field. In FIG. 8b, we plot the differential conductivity, dI/dV, as a function of applied current I at few characteristic temperatures. At T=30 K, when the system is on the cusp of a transition to the spin solid state, a nearly symmetric colossal enhancement in differential conductivity for both positive and negative current directions is detected. As soon as temperature increases to T=40 K, the differential conductivity becomes highly asymmetric. In fact, there is a very little change in dI/dV for almost entire negative current range. As soon as the current direction is reversed, a subtle increase in the differential conductivity is recorded. This process becomes more prominent as measurement temperature increases. Above T=220 K, the differential conductivity gradually decreases and tends to become symmetric again, albeit weakly, at T~300 K. This behavior is also reflected in the output electric power measurements at different temperatures (see FIG. 9). Since the development of the asymmetric current biasing follows the same temperature dependence as the evolution of magnetic correlation in the artificial honeycomb lattice, it can be argued that the underlying magnetism plays an important role in this anomalous behavior. In the spin solid state at low temperature, the vortex circulation of magnetization does not exhibit any preferential direction for the current circulation. On the other hand, at higher temperature the honeycomb lattice assumes the short-range ordered spin ice state with possible preferential conductivity biasing along the local anisotropic <11> direction. Surprisingly, no field dependence of differential conductivity was observed. Previously, it was demonstrated that the oxidation of magnetic film in large element size honeycomb lattice can cause asymmetry in the electrical properties e.g. magnetoresistance (MR), due to the exchange bias effect. The asymmetric effect, as reported here, is different from the previously observed asymmetric MR on two counts: first, the asymmetry in the differential conductance occurs at higher temperature, instead of low temperature in the large element size honeycomb lattice where the exchange bias is prominent. Second, the effect is field independent (up to 500 Oe) in our case. In many ways, the asymmetric current biasing in artificial permalloy honeycomb lattice reminisces of the p-n junction diode, where the current is controlled to flow in the desired direction by using p- or n-type dopants in a semiconductor. This unique finding in a magnetic material can be utilized to create a magnetic transistor, thus provides a new platform for the spintronics applications.

Having illustrated and described the principles of the present invention, it should be apparent to persons skilled in the art that the invention can be modified in arrangement and detail without departing from such principles.

Although the materials and methods of this invention have been described in terms of various embodiments and illustrative examples, it will be apparent to those of skill in the art that variations can be applied to the materials and methods described herein without departing from the concept, spirit and scope of the invention. All such similar substitutes and modifications apparent to those skilled in the art are deemed to be within the spirit, scope and concept of the invention as defined by the appended claims.

What is claimed is:

1. A magnetic artificial honeycomb lattice comprising a multiplicity of connecting elements separated by hexagonal cylindrical pores, wherein:
   (a) the hexagonal cylindrical pores:
      (i) have widths that are substantially uniform and an average width that is in a range of about 15 nm to about 20 nm; and
      (ii) are substantially equispaced and have an average center-to-center distance that is in a range of about 25 nm to about 35 nm; and (b) the connecting elements comprise a magnetic material layer, and the connecting elements have:
  (i) lengths that are substantially uniform and an average length that is in a range of about 10 nm to about 15 nm;
  (ii) widths that are substantially uniform and an average width that is in a range of about 4 nm to about 8 nm; and
  (iii) a thickness of the magnetic material layer that is substantially uniform and an average thickness that is in a range of about 2 nm to about 8 nm; and
(c) the magnetic artificial honeycomb lattice has a surface area, disregarding the presence of the hexagonal cylindrical pores, that is in a range in a range of about 100 mm$^2$ to about 900 mm$^2$.

2. The magnetic artificial honeycomb lattice of claim 1, wherein:
the surface area of the substrate is in a range 225 mm$^2$ to about 400 mm$^2$ and a thickness in a range of about 34 nm to about 36 nm;
the average depth of the hexagonal cylindrical pores is in a range of about 8 nm to about 10 nm;
the average length of the connecting elements is in a range of about 12 nm to about 14 nm and the average width of the connecting elements is in a range of about 4 nm to about 6 nm; and
the average thickness of the magnetic material layer is in a range of about 4 nm to about 7 nm.

3. The magnetic artificial honeycomb lattice of claim 1, wherein the average length of the connecting elements (l) and the average thickness of the magnetic material layer of the connecting element (t) are at an aspect ratio of l/t that is in a range of about 1.25 to about 7.5.

4. The magnetic artificial honeycomb lattice of claim 1, wherein the average length of the connecting elements of the artificial honeycomb lattice (l) and the average thickness of the magnetic layer (t) are at an aspect ratio of l/t that is in a range of about 2 to about 3.

5. The magnetic artificial honeycomb lattice of claim 1, wherein the magnetic material is selected from the group consisting of nickel, iron, cobalt, molybdenum, one or more Permalloys, and combinations or mixtures, or alloys thereof.

6. The magnetic artificial honeycomb lattice of claim 1, wherein the magnetic material is a Permalloy comprising 80% Ni, 14.48% Fe, 5% Mo 0.5% Si, and 0.02% Cu.

7. The magnetic artificial honeycomb lattice of claim 1, wherein the magnetic artificial honeycomb lattice exhibits asymmetric differential electrical conductance (or unidirectional electronic transport) without application of magnetic field when at a temperature in a range of about 60 K to about 300 K and subjected to a current in a range of about 15 μA to about −15 μA, wherein the conductance increases by at least two orders of magnitude for one current bias compared to a zero bias.

8. The magnetic artificial honeycomb lattice of claim 7, wherein the temperature of the magnetic artificial honeycomb lattice is in a range of about 150 K to about 275 K.

9. The magnetic artificial honeycomb lattice of claim 7, wherein the temperature of the magnetic artificial honeycomb lattice is in a range of about 200 K to about 250 K.

10. The magnetic artificial honeycomb lattice of claim 1, wherein the connecting elements further comprise a layer of non-magnetic, protective material on the magnetic material layer to prevent or limit oxidation or other corrosion of the magnetic material.

11. A method of adjusting the degree of the asymmetric differential electrical conductance (or unidirectional electronic transport) of the magnetic artificial honeycomb lattice of claim 7 without varying the amount of current or the current bias, the method comprising:
(a) varying the temperature of the magnetic artificial honeycomb lattice;
(b) applying a magnetic field to the magnetic artificial honeycomb lattice; or
(c) both (a) and (b).

12. A method of making a making a magnetic artificial honeycomb lattice, the method comprising depositing a layer of magnetic material on a substrate, wherein:
the substrate comprises an artificial honeycomb lattice topography, wherein the artificial lattice topography is over a surface area of the substrate that is in a range in a range of about 100 mm$^2$ to about 900 mm$^2$, and wherein the artificial lattice topography comprises a multiplicity of connecting elements separated by hexagonal cylindrical pores, wherein;
(a) the hexagonal cylindrical pores:
  (i) have widths that are substantially uniform and an average width that is in a range of about 15 nm to about 20 nm;
  (ii) are substantially equispaced and have an average center-to-center distance that is in a range of about 25 nm to about 35 nm; and
  (iii) have depths extending inward from the surface of the substrate that are substantially uniform and an average depth that is in a range of about 5 nm to about 10 nm; and
(b) the connecting elements have:
  (i) lengths that are substantially uniform and an average length that is in a range of about 10 nm to about 15 nm;
  (ii) widths that are substantially uniform and an average width that is in a range of about 4 nm to about 8 nm; and
  (iii) heights that are substantially uniform corresponding to the depths of the hexagonal cylindrical pores; and
wherein the layer of magnetic material is deposited on substantially only the uppermost surfaces of the connecting elements of the artificial honeycomb lattice topography of the substrate, and wherein the magnetic material layer has a thickness that is substantially uniform and an average thickness that is in a range of about 2 nm to about 8 nm.

13. The method of claim 2, wherein:
the surface area of the substrate is in a range 225 mm$^2$ to about 400 mm$^2$ and a thickness in a range of about 34 nm to about 36 nm;
the average depth of the hexagonal cylindrical pores is in a range of about 8 nm to about 10 nm;
the average length of the connecting elements is in a range of about 12 nm to about 14 nm and the average width of the connecting elements is in a range of about 4 nm to about 6 nm; and
the average thickness of the magnetic material layer is in a range of about 4 nm to about 7 nm.

14. The method of claim 12, wherein the average length of the connecting elements of the artificial honeycomb lattice (l) and the average thickness of the magnetic layer (t) are at an aspect ratio of l/t that is in a range of about 1.25 to about 7.5.

15. The method of claim 12, wherein the average length of the connecting elements of the artificial honeycomb lattice (*l*) and the average thickness of the magnetic layer (*t*) are at an aspect ratio of l/t that is in a range of about 2 to about 3.

16. The method of claim 12, wherein:
the substrate is that is on a substrate is selected from the group consisting of silicon nitride ($Si_3N_4$), and a single-crystal silicon wafer; and
the magnetic material is selected from the group consisting of nickel, iron, cobalt, molybdenum, one or more Permalloys, and combinations or mixtures, or alloys thereof.

17. The method of claim 16, wherein:
the substrate is a single-crystal silicon wafer; and
the magnetic material is a Permalloy comprising 80% Ni, 14.48% Fe, 5% Mo 0.5% Si, and 0.02% Cu.

18. The method of claim 12, wherein the depositing of the layer of the magnetic material on substantially only the uppermost surfaces of the connecting elements of the artificial honey comb lattice topography of the substrate comprises depositing the magnetic material from a surface of an evaporation source via electron- beam evaporation, wherein the uppermost surfaces of the connecting elements are maintained in a near parallel orientation relative to a direction perpendicular to the surface of the evaporation source while the substrate is rotated about a central axis at a substantially constant rate.

19. The method of claim 18, wherein the near parallel orientation comprises an angle between the perpendicular direction and the uppermost surfaces of the connecting elements of the artificial honey comb lattice topography that is in a range of about 1° to about 2°.

20. The method of claim 12, further comprising depositing a layer of non-magnetic, protective material on the layer of the magnetic material to prevent or limit oxidation or other corrosion of the magnetic material.

* * * * *